United States Patent [19]

Olsen

[11] Patent Number: 4,620,262
[45] Date of Patent: Oct. 28, 1986

[54] PYROELECTRIC ENERGY CONVERTER ELEMENT COMPRISING VINYLIDENE FLUORIDE-TRIFLUOROETHYLENE COPOLYMER

[76] Inventor: Randall B. Olsen, 3025 Via de Caballo, Olivenhain, Calif. 92024

[21] Appl. No.: 650,250

[22] Filed: Sep. 13, 1984

[51] Int. Cl.⁴ .................. H01B 3/44; H02N 1/00; H01G 4/08
[52] U.S. Cl. .................... 361/323; 252/580; 322/2 A
[58] Field of Search .......... 322/2 A, 2 R; 361/311, 361/323, 328; 252/580, 581

[56] References Cited

U.S. PATENT DOCUMENTS

| | | | |
|---|---|---|---|
| 3,243,687 | 3/1966 | Hoh | 322/2 R |
| 4,173,033 | 10/1979 | Sako et al. | 361/323 |
| 4,220,906 | 9/1980 | Drummond | 322/2 A |
| 4,302,408 | 11/1981 | Ichihara et al. | 264/22 |
| 4,425,540 | 1/1984 | Olsen | 322/2 A |

OTHER PUBLICATIONS

Ferroelectrics 1981, vol. 38, pp. 975-978, A Pyroelectric Energy Converter which Employs Regeneration.

Primary Examiner—Donald A. Griffin

[57] ABSTRACT

A polymeric dielectric having outstanding pyroelectric conversion properties, which essentially consists of a copolymer of vinylidene fluoride and trifluoroethylene in a molar ratio of from about 90:10 to 10:90.

4 Claims, 9 Drawing Figures

PYROELECTRIC ENERGY CONVERTER ELEMENT COMPRISING VINYLIDENE FLUORIDE-TRIFLUOROETHYLENE COPOLYMER

FIELD OF INVENTION

This invention relates to pyroelectric conversion of heat to electrical energy and specifically an improved pyroelectric material.

CROSS REFERENCE TO RELATED APPLICATION

U.S. patent application Ser. No. 585,426; file date 03-02-84.

BACKGROUND OF THE INVENTION

The present invention relates to a polymeric dielectric having outstanding pyroelectric conversion properties. More particularly, it relates to a polymeric dielectric highly improved in pyroelectric conversion properties and suitable for use in various devices for the conversion of heat into electricity by means of the pyroelectric effect.

DESCRIPTION OF THE PRIOR ART

Recent advances in pyroelectric conversion have included a thousand-fold increase in the demonstrated efficiency and a fifty-thousand-fold f increase in the demonstrated power output. The technology of pyroelectric conversion is rapidly establishing itself as a highly competitive approach to conversion of low temperature heat (below 300° C.) into electrical energy.

The polymeric material of the present invention has been described previously by Sako et. al. (U.S. Pat. No. 4,173,033) and Ichihara and Seo (U.S. Pat. No. 4,302,408) for use in piezoelectric devices and pyroelectric detectors. The high electric field properties of the polymeric material, as described herein, allow said material to be employed in pyroelectric energy conversion devices. It is important to note the distinct difference between pyroelectric energy conversion and the well known pyroelectric detection. As the names imply, the former relates to the production of substantial quantities of electrical power by means of a cyclical thermodynamic process, whereas, the latter refers to the sensitive detection of thermal radiation.

Several recent improvements in the technology of pyroelectric energy conversion have been described by Olsen (U.S. Pat. No. 4,425,540). Earlier, related methods of converting heat into electrical energy were described by Drummond (U.S. Pat. No. 4,220,906) and Hoh (U.S. Pat. No. 3,243,687).

SUMMARY OF THE INVENTION

Important to this emerging technology is the active pyroelectric material itself. As the result of extensive study on polymeric dielectrics, it has now been surprisingly and unexpectedly found that the modification of a vinylidene fluoride polymer with trifluoroethylene to a certain extent results in highly improved pyroelectric conversion properties. The present invention is based on this finding.

DETAILED DESCRIPTION OF THE INVENTION

Figure 1:
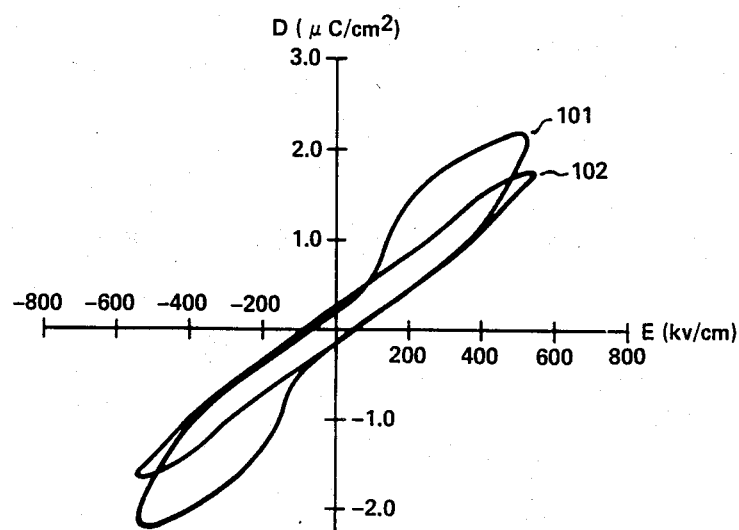
FIG. 1 shows the D, displacement versus E, electric field of the copolymer with 37% molar content of vinylidene fluoride.
Figure 2:
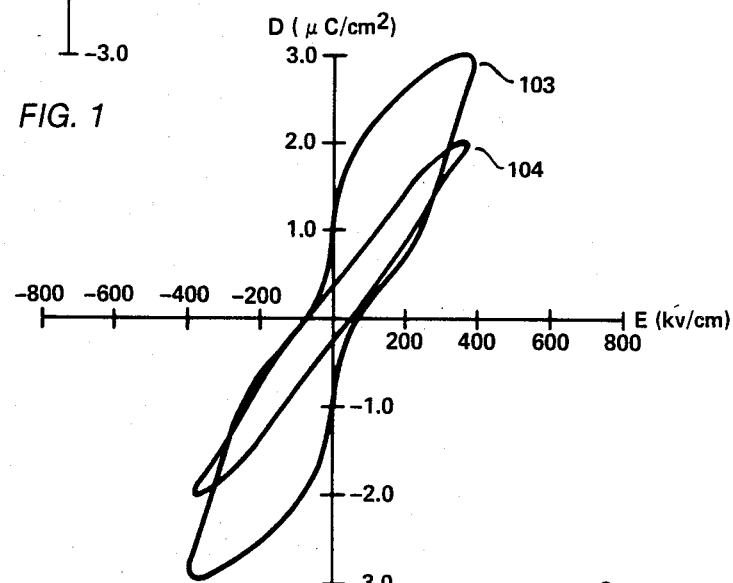
FIG. 2 shows the D versus E for the copolymer with 52% molar content of vinylidene fluoride.
Figure 3:
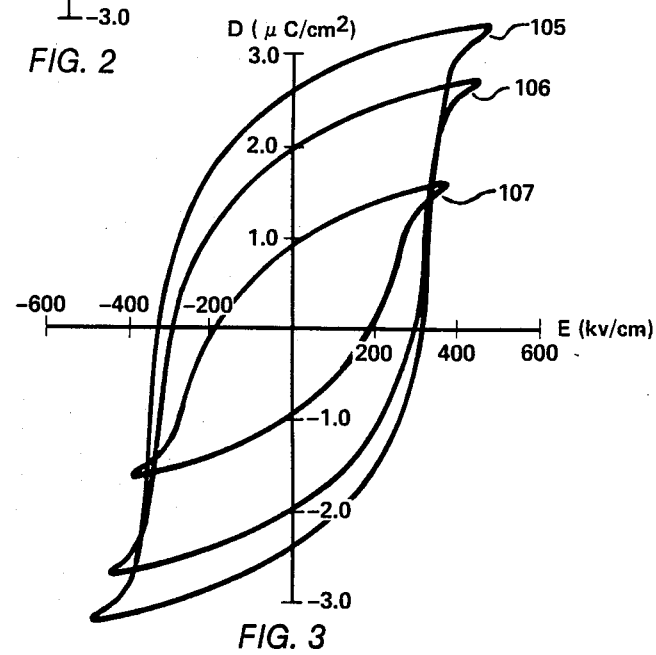
FIG. 3 shows the D versus E for the copolymer with 73% vinylidene fluoride.

The pyroelectric conversion properties of vinylidene fluoride-trifluoroethylene copolymer may be understood from FIGS. 1 to 3 of the accompanying drawings. The graphs of the figures were obtained from the measurements of the electrical characteristics of vinylidene fluoride-trifluoroethylene copolymers which were prepared in the procedure as hereinafter exemplified. For the measurements, the specimens of the copolymers were prepared by the following procedure: placing polymer powders on the flat surface of a mold, heating the powders together with the mold by a heat press of 200° C. for 10 minutes, and pressing them using the heat press under a pressure of 3000 p.s.i. for 10 minutes to make a sheet of about 30 μm in thickness.

FIG. 1 shows the electric displacement, D, versus applied electric field, E, hysteresis loops for various temperatures, for the copolymer of vinylidene fluoride-trifluoroethylene which is comprised of 37% of the former. The hysteresis loops, FIGs. 1, 2, and 3, were measured at 2 Hz by varying the voltage (electric field) applied to electrodes which had been vacuum deposited onto the surfaces of the copolymer. The hysteresis loop marked 101 represents the D versus E behavior at 50° C. The other loop, 102, represents the corresponding behavior at 80° C. The characteristic of FIG. 1 which enables the copolymer to be used as a pyroelectric conversion material is that the higher temperature loops display reduced electric displacement at high electric fields. This behavior allows the use of the pyroelectric conversion cycle described by Olsen (U.S. Pat. No. 4,425,540) as well as other cycles which have been described in the open literature, to be performed by the copolymer.

FIG. 2 shows the D versus E hysteresis loops measured for the copolymer of vinylidene fluoride-trifluoroethylene for which the mole fraction of the former is 52%. The hysteresis loop marked 103 represents the D versus E behavior at 50° C. The other loop, marked 104, represents the corresponding behavior at 80° C.

FIG. 3 shows the D versus E loops measured for the copolymer of vinylidene fluoride-trifluoroethylene which is comprised of 73% of the former. The loops marked 105, 106, 107 represent the behavior at 40° C., 70° C., and 100° C., respectively. In both FIG. 3 and FIG. 2 the characteristic which allows the copolymers to be used for substantial pyroelectric conversion is that the higher temperature loops display reduced electric displacement at high electric fields.

The improvements which the copolymer represents over the previously existing pyroelectric material (e.g. ceramic lead zirconate modified with lead and tin) include but are not limited to; (a) flexibility, (b) low cost raw materials, (c) ease of manufacture in large area sheet form and (d) a low temperature Curie point, 70° C., which allows low temperature pyroelectric energy conversion. In addition the dielectric strength of the copolymer is at least 500 kV/cm which is roughly ten times greater than that of present lead zirconate ceramic.

According to the present invention, there is provided a polymeric dielectric having highly improved pyroelectric conversion properties which essentially consists of a copolymer of vinylidene fluoride and trifluoroethylene in a molar ratio from about 90:10 to 10:90.

The vinylidene fluoride-trifluoroethylene copolymer of the invention may be produced by polymerization of vinylidene fluoride and trifluoroethylene according to a per se conventional procedure as described by Sako (U.S. Pat. No. 4,173,033).

The vinylidene fluoride-trifluoroethylene copolymer of the invention can be shaped into various forms by conventional melt molding techniques (e.g. compression molding, extrusion molding, injection molding). Alternatively, it may be dissolved or dispersed into a liquid medium at room temperature or an elevated temperature, followed by application of the resulting solution or dispersion onto a substrate material to make a film. As another alternative way, it may be powder-coated onto the surface of a substrate material to make a coating layer.

A dielectric to be used for pyroelectric conversion is desired to have not only pyroelectric properties but also a sufficient insulating property. The vinylidene fluoride-trifluoroethylene copolymer has a volume resistivity of $5 \times 10^{14}$ Ω-cm at 20° C. and at least $3 \times 10^{13}$ Ω-cm at 80° C. As a result the loss, due to conduction, of energy during pyroelectric conversion is minimal. Thus the copolymer of the invention is highly useful as a dielectric for pyroelectric conversion of heat into electrical energy. When directed to such use, it is usually constructed in the form of a film with electrodes attached to its surfaces in a capacitor-like manner. The electrodes may be of metal foil but in the presently preferred form they are either vacuum evaporation deposited metal films or vacuum sputtered metal films (0.05 to 2 μm thick). Examples of the metal of which the metal foil or the metal coating may be formed are aluminum and nickel.

Figure 4:
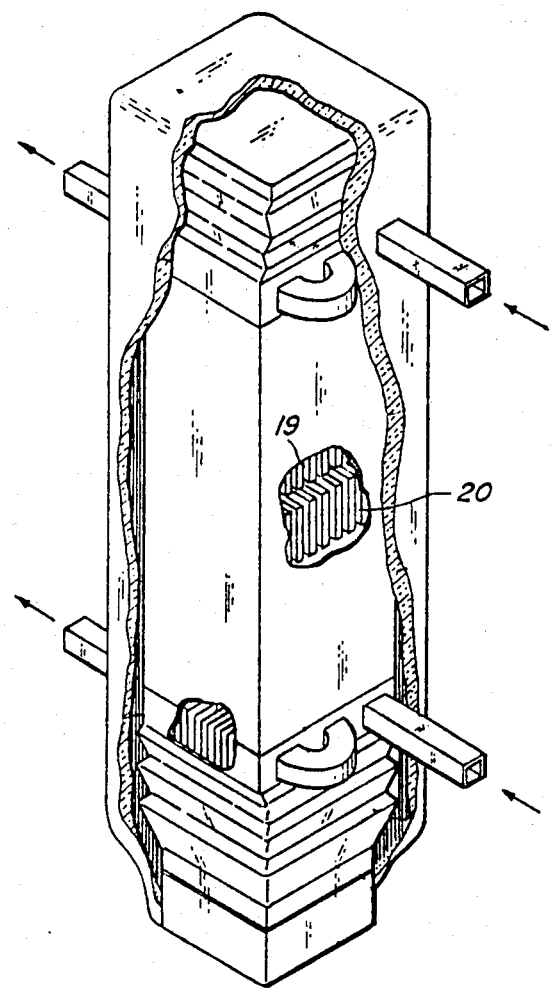
FIG. 4 is a perspective view of a form of the pyroelectric converter apparatus, parts being broken away to show interior structure.
Figure 5:
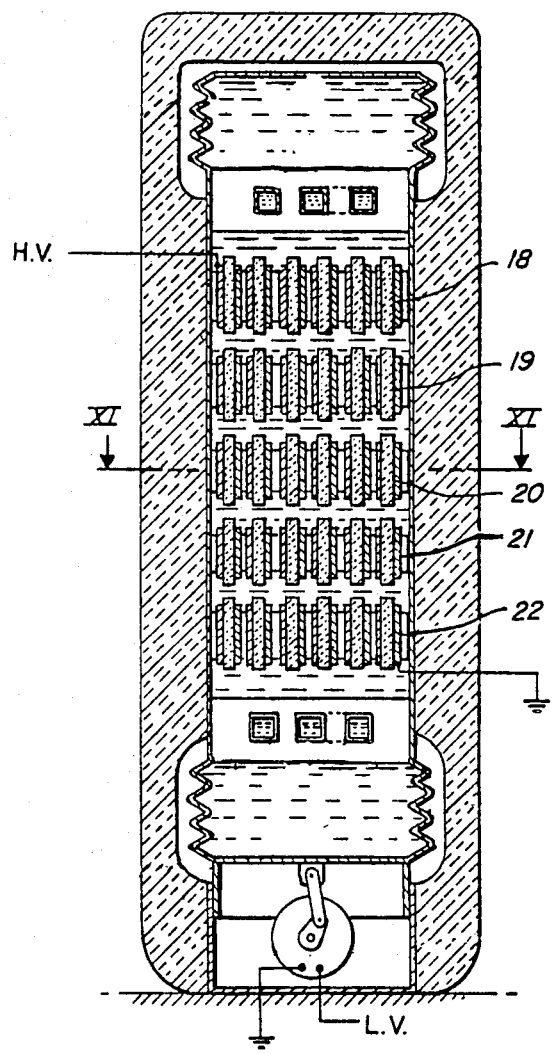
FIG. 5 is a vertical sectional view of the apparatus of FIG. 4.

A typical example of a copolymer film utilized in a pyroelectric energy converter will be hereinafter illustrated with reference to the accompanying drawings wherein:

FIG. 4 is a perspective view of a form of the apparatus, parts being broken away to show interior structure;

FIG. 5 is a vertical sectional view of the apparatus of FIG. 4; and

Figure 6:
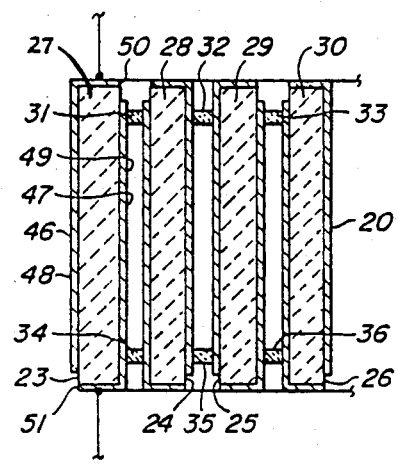
FIG. 6 is an enlarged fragmentary horizontal sectional view of a copolymer film stack as viewed along the line XI—XI of FIG. 5.

FIG. 6 is an enlarged fragmentary horizontal sectional view of a copolymer film stack as viewed along the line XI—XI of FIG. 5. More particularly, the copolymer film stack portion illustrated in FIG. 6 comprises capacitor-like units 23, 24, 25 and 26 which comprise, respectively, dielectric materials in the form of elongated horizontally spaced, vertical rectangular plates 27, 28, 29 and 30. The plates 27 to 30 are formed of the copolymer of vinylidene fluoride-trifluoroethylene. Each capacitor-like unit is provided with a pair of similar metal contact electrodes.

In FIG. 5 the copolymer film stacks 18, 19, 20, 21 and 22, are in horizontally spaced parallel relation by virtue of insulating spacers interposed therebetween as shown at 31 to 36 in FIG. 6. copolymer film stack illustrated in FIG. 6 shows the capacitor-like units thereof electrically connected in parallel circuit relation. If suitable and desired, the capacitor-like units of any stack may be connected in series circuit relation or a combination of series and parallel, rather than as shown. Similarly, the stacks 18 to 22 are preferably connected in parallel circuit relation, but may, if suitable and desired, be connected in series circuit relation or a combination of series and parallel.

Figure 7:
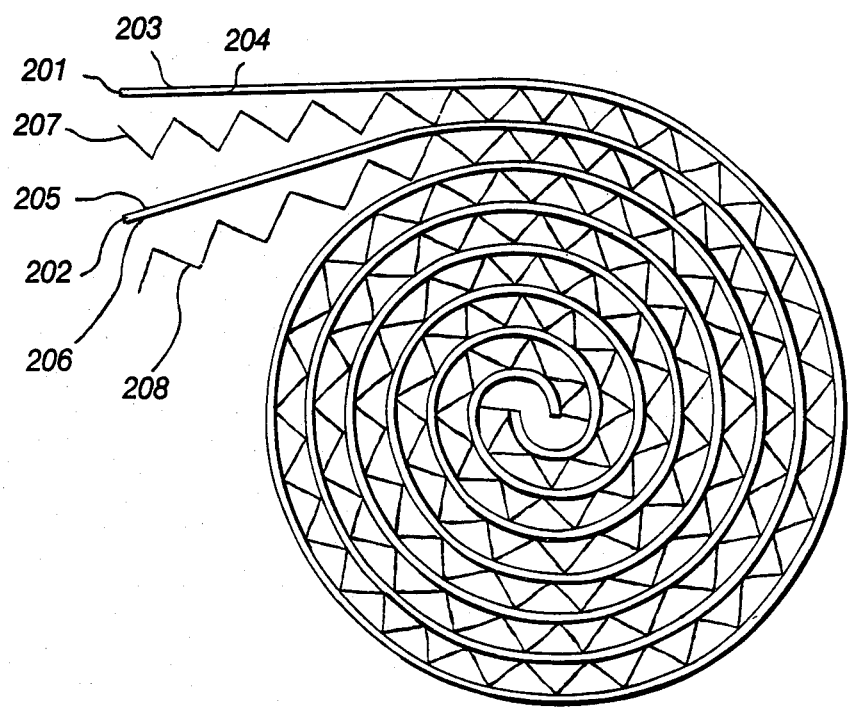
FIG. 7 shows a copolymer film stack which is in the form of a wound spiral of two layers of electroded dielectric separated by spacers.
Figure 8:
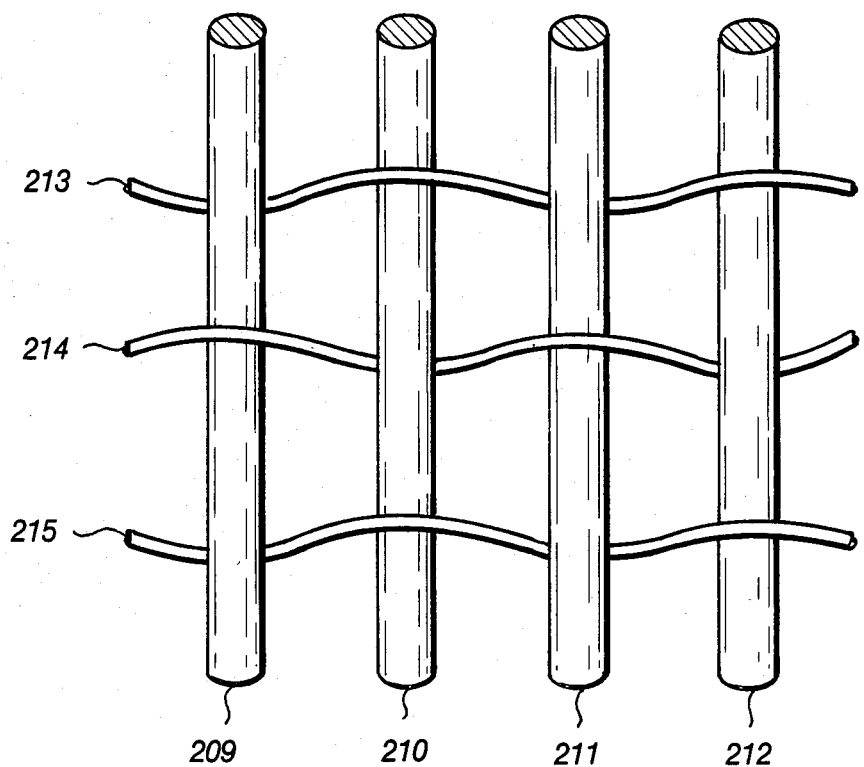
FIG. 8 shows a screen mesh form of spacer.

An alternative and presently the preferred form of the copolymer film stack is illustrated in horizontal sectional view in FIG. 7. The stack is in the form of a wound spiral of two layers of copolymer film 201 and 202 with surfaces electroded, 203 and 204, and 205 and 206 respectively, and separated by spacers 207 and 208. The surface electrodes 203, 204, 205, and 206, being for example, vacuum evaporated thin metal electrodes (e.g. 1000 Angstrom thick aluminum). The spacers may be of a variety of types but the presently preferred form of spacer, illustrated in FIG. 8 in vertical view, is a screen mesh comprised of relatively larger diameter (200 to 500 μm) fibrils, 209, 210, 211, and 212, in the vertical direction, and relatively smaller diameter (roughly one third the diameter of the vertical fibrils or smaller) fibrils, 213, 214, 215, interwoven between the vertical fibrils in the horizontal direction. The large diameter fibrils maintain the spatial separation between adjacent dielectric film layers. The small diameter fibrils serve to locate the large fibrils while allowing heat transfer fluid to flow between the adjacent films. Examples for materials from which the screen form of spacer may be made are a metal, e.g. copper, or a polymer, e.g. a polyimide.

The voltages applied to the electrodes of the copolymer films may be assigned in at least two ways but the presently preferred assignment is such that electrodes which touch a common spacer share a like voltage. For example, the voltage of electrodes 205 and 204 may be kept equal at, say, ground potential while the other electrodes 203 and 206 are maintained at a high voltage. This arrangement of voltages prevents both electrical conduction and arcing through both spacer material and heat transfer fluid which fill the spacers between copolymer layers.

Figure 9:
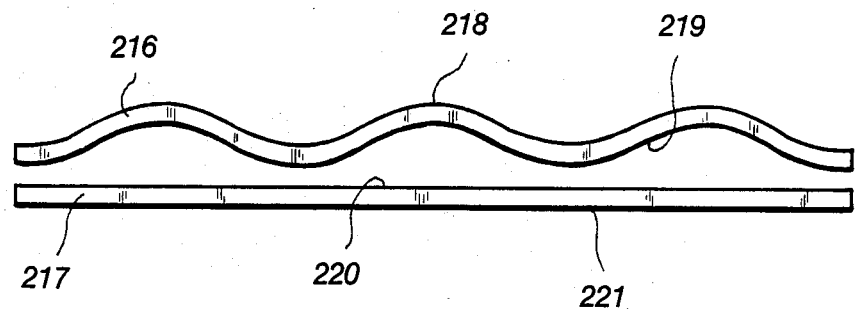
FIG. 9 illustrates, in horizontal sectional view, a form of the copolymer film stack which does not require separate spacers.

FIG. 9 illustrates, in horizontal sectional view, a form of the copolymer film stack which eliminates the need for spacers. Shown in FIG. 9 are two copolymer films 216 and 217 with electrodes 218 and 219, and 220 and 221, respectively. Copolymer film 216 is shown to be in the form of a wavy surface. The wavy form of 216 automatically places most of the bulk of 216 in a spatially separated location relative to the flat film 217 thereby eliminating the need for separate spacer elements. Though FIG. 9 shows a wavy form other similar forms of 216 (e.g. ridges or bumps) will achieve essentially the same autospacing effect. This method of self spacing may be used with the copolymer in pyroelectric conversion devices regardless of whether the rectangular stack (similar to FIG. 6) or the spiral wound stack is employed.

Other portions of the pyroelectric energy converter which are not contained within the copolymer film stacks are described elsewhere (Olsen, U.S. Pat. No. 4,425,540).

While the presently preferred embodiment of the invention has been illustrated and described, various changes, equivalents and alternatives may be resorted to without departing from the spirit of the invention, and all such changes, equivalents and alternatives are contemplated as may come within the scope of the appended claims and equivalents thereof.

What is claimed as the invention is:

1. A film stack for use in a pyroelectric energy converter which essentially consists of films of a copolymer of vinylidene fluoride and trifluoroethylene in a molar ratio of from about 90:10 to about 10:90, the surfaces of said films being substantially covered on both sides with thin metallic electrodes wherein the said films are wound about a central cylindrical core in a spiral fashion to form said stack into a cylindrical form.

2. A cylindrical geometry pyroelectric energy converter wherein the energy conversion element is in cylindrical stack form according to claim 1.

3. A pyroelectric energy conversion film stack, which essentially consists of films of a copolymer of vinylidene fluoride and trifluoroethylene in a molar ratio of from about 90:10 to about 10:90, the surfaces of said films being substantially covered on both sides with thin metallic electrodes, wherein a separation between adjacent copolymer films is maintained by a screen mesh.

4. A pyroelectric energy conversion film stack, which essentially consists of films of a copolymer of vinylidene fluoride and trifluoroethylene in a molar ratio of from about 90:10 to about 10:90, the surfaces of said films being substantially covered on both sides with thin metallic electrodes, wherein a separation between adjacent copolymer films is maintained by a screen mesh, and said separation is automatically maintained by means of spacers which are integral parts of said dielectric films.

* * * * *